(12) United States Patent
Park et al.

(10) Patent No.: US 11,794,220 B2
(45) Date of Patent: Oct. 24, 2023

(54) FLUID SUPPLY UNIT AND SUBSTRATE TREATING APPARATUS HAVING THE SAME

(71) Applicant: SEMES CO., LTD., Cheonan-si (KR)

(72) Inventors: Inhwang Park, Suwon-si (KR); Gui Su Park, Cheonan-si (KR); Young Hun Lee, Cheonan-si (KR); Youngseop Choi, Cheonan-si (KR); Seung Hoon Oh, Cheonan-si (KR); Jonghyeon Woo, Asan-si (KR); Jin Mo Jae, Geoje-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 440 days.

(21) Appl. No.: 16/924,633

(22) Filed: Jul. 9, 2020

(65) Prior Publication Data
US 2021/0008606 A1    Jan. 14, 2021

(30) Foreign Application Priority Data

Jul. 10, 2019 (KR) .......................... 10-2019-0083113

(51) Int. Cl.
*B08B 7/00* (2006.01)
*H01L 21/67* (2006.01)

(52) U.S. Cl.
CPC ........ *B08B 7/0021* (2013.01); *H01L 21/6719* (2013.01); *H01L 21/67028* (2013.01); *H01L 21/67051* (2013.01); *H01L 21/67103* (2013.01)

(58) Field of Classification Search
CPC ........... H01L 21/67051; H01L 21/6719; H01L 21/67103; H01L 21/67028; B08B 7/0021
See application file for complete search history.

(56) References Cited

U.S. PATENT DOCUMENTS

2018/0112884 A1*  4/2018  Goryu .................... F28F 1/006

FOREIGN PATENT DOCUMENTS

| JP | 2008-177205 A | 7/2008 |
|---|---|---|
| JP | 2008-182034 A | 8/2008 |
| JP | 2012-136423 A | 7/2012 |
| JP | 2018-93110 A | 6/2018 |
| KR | 2002-0032173 A | 5/2002 |
| KR | 10-2013-0007396 A | 1/2013 |
| KR | 2013-0134996 A | 12/2013 |
| KR | 2018-0064985 A | 6/2018 |
| KR | 2018-0099053 A | 9/2018 |

* cited by examiner

*Primary Examiner* — Benjamin L Osterhout
(74) *Attorney, Agent, or Firm* — Harness, Dickey & Pierce, P.L.C.

(57) ABSTRACT

An apparatus for treating a substrate includes a process chamber having a treatment space for treating the substrate; a fluid supply unit for supplying fluid to the treatment space, wherein the fluid supply unit includes: a supply pipe connected to the treatment space to supply the fluid to the treatment space; a pump installed in the supply pipe to provide flow pressure to the fluid; a vent line installed between the pump and the process chamber to discharge pressure in the fluid to an outside; a relief valve installed in the vent line to open and close the vent line; and a reservoir installed between the pump and a branch point wherein the vent line branches from the supply pipe, wherein the reservoir has a cross-sectional area larger than a cross-sectional area of a portion of the supply pipe located between the pump and the branch point.

20 Claims, 4 Drawing Sheets

FLUID SUPPLY UNIT AND SUBSTRATE TREATING APPARATUS HAVING THE SAME

CROSS-REFERENCE TO RELATED APPLICATIONS

A claim for priority under 35 U.S.C. § 119 is made to Korean Patent Application No. 10-2019-0083113 filed on Jul. 10, 2019, in the Korean Intellectual Property Office, the entire contents of which are hereby incorporated by reference.

BACKGROUND

Embodiments of the inventive concept described herein relate to a fluid supply unit and a substrate treating apparatus having the same.

In general, a semiconductor device is manufactured from a substrate, such as a wafer. Specifically, the semiconductor device is manufactured by performing a deposition process, a photolithography process, an etching process, or the like to form a fine circuit pattern on a top surface of the substrate.

As the top surface of the substrate on which the circuit pattern is formed may be contaminated with various foreign substances while performing the above processes, a cleaning process may be performed to remove the foreign substances.

Recently, supercritical fluid is used in the process of cleaning the substrate. In one example, in the cleaning process, isopropyl alcohol (hereinafter, IPA) is used to clean the top surface of the substrate and then carbon dioxide ($CO_2$) in a supercritical state is fed to the top surface of the substrate, thereby removing the IPA remaining on the substrate.

In a cleaning apparatus, piping (carbon dioxide supply line) for supplying the carbon dioxide is equipped with a condenser, a pump, and a relief valve for discharging carbon dioxide above a reference pressure. When an abnormal stop occurs in a process of setting the cleaning apparatus or in a test operation process thereof, an on-off valve of the carbon dioxide supply line is closed, and thus an instantaneous pressure rise occurs. When the pressure rises in the supply line of the carbon dioxide, the relief valve operates, such that possibility of bellows damage in the relief valve and process contamination may increase.

SUMMARY

Embodiments of the inventive concept provide a fluid supply unit capable of suppressing pressure hunting phenomenon in a supply line of supercritical fluid and a substrate treating apparatus having the same.

A purpose of the inventive concept is not limited thereto. Other purposes as not mentioned will become apparent to those skilled in the art from following descriptions.

According to an exemplary embodiment, an apparatus for treating a substrate includes a process chamber having a treatment space for treating the substrate; a fluid supply unit for supplying fluid to the treatment space, wherein the fluid supply unit includes: a supply pipe connected to the treatment space to supply the fluid to the treatment space; a pump installed in the supply pipe to provide flow pressure to the fluid; a vent line installed between the pump and the process chamber to discharge pressure in the fluid to an outside; a relief valve installed in the vent line to open and close the vent line; and a reservoir installed between the pump and a branch point wherein the vent line branches from the supply pipe, wherein the reservoir has a cross-sectional area larger than a cross-sectional area of a portion of the supply pipe located between the pump and the branch point.

Further, the reservoir may have a pipe shape.

Further, the reservoir may have a rugby ball shape in which both ends thereof have the same cross-sectional area of the portion of the supply pipe, and a cross-sectional area of the reservoir increases as the reservoir extends from each end toward a middle point of the reservoir.

Further, the fluid may be supercritical state fluid.

Further, the reservoir may contain inertia fluid having inertia for suppressing pressure hunting of the fluid.

According to an exemplary embodiment, a fluid supply unit includes a supply pipe along which fluid flows; a pump installed in the supply pipe to provide flow pressure to the fluid; a vent line installed at a rear end of the pump to discharge pressure in the fluid to an outside; and a relief valve installed in the vent line to open and close the vent line, wherein the supply pipe includes a flow-path enlarging pipe installed between the pump and a branch point where the vent line branches from the supply pipe, wherein the flow-path enlarging pipe has a cross-sectional area larger than a cross-sectional area of the supply pipe to alleviate pressure variation in the supply pipe.

Further, the fluid may be supercritical state fluid.

Further, the flow-path enlarging pipe may contain inertia fluid having inertia to suppress a pressure hunting phenomenon of the fluid.

Further, the flow-path enlarging pipe may have a rugby ball shape in which both ends thereof have the same cross-sectional area of the supply pipe, and a cross-sectional area of the flow-path enlarging pipe increases as the flow-path enlarging pipe extends from each end toward a middle point of the flow-path enlarging pipe.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
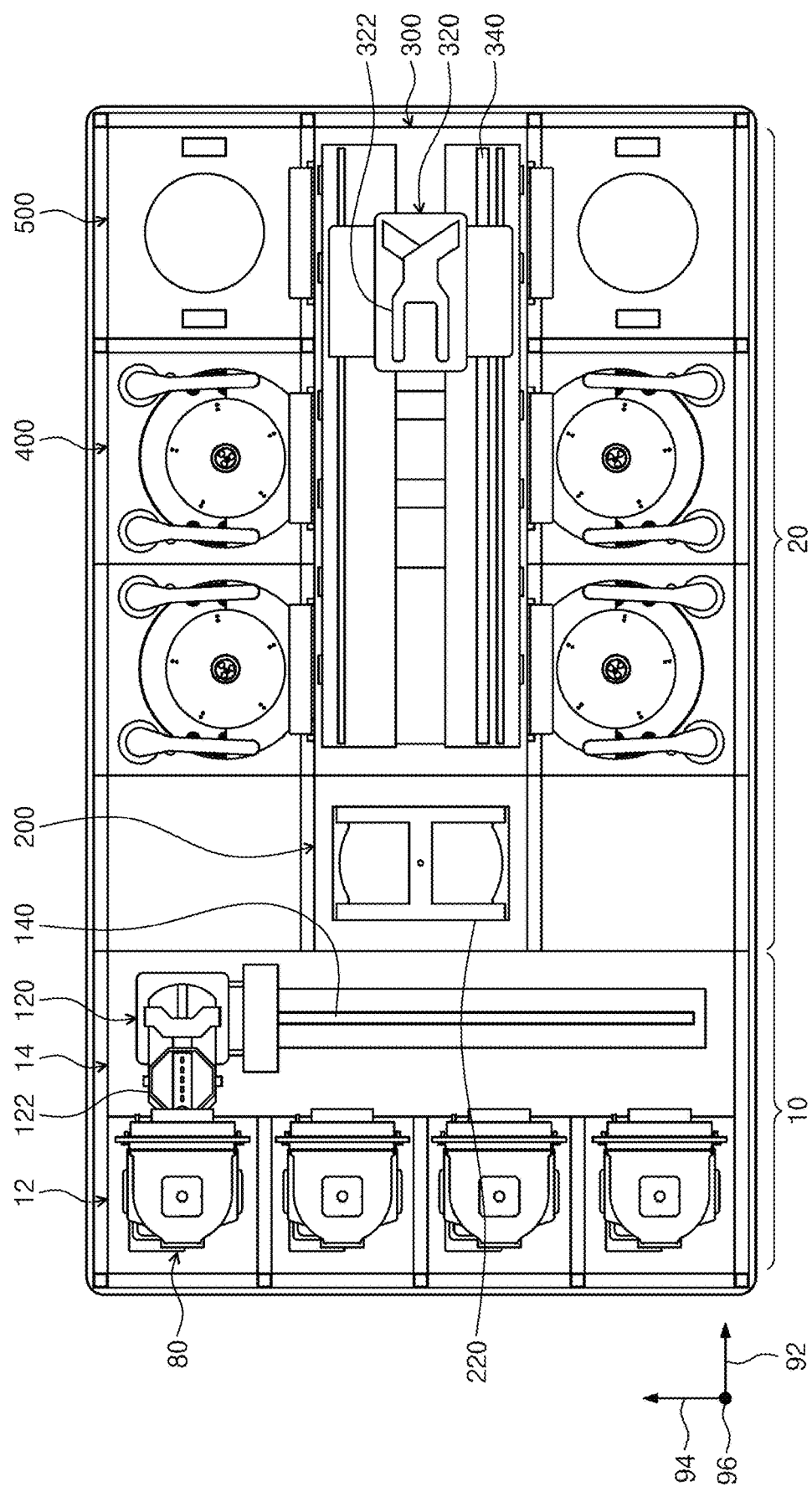
FIG. 1 is a plan view schematically showing a substrate treating apparatus according to an embodiment of the inventive concept.

Hereinafter, embodiments of the inventive concept will be described in more detail with reference to the accompanying drawings. The embodiments of the inventive concept may be modified in various forms. The scope of the inventive concept should not be construed as being limited to the embodiments below. The embodiments are provided to explain the inventive concept more fully to those skilled in the art. Therefore, a shape of each of elements in the drawings is exaggerated for clearer description.

FIG. 1 is a plan view schematically showing a substrate treating system according to an embodiment of the inventive concept.

Referring to FIG. 1, the substrate treating system includes an index module 10, a treating module 20, and a controller. In one embodiment, the index module 10 and the treating module 20 are arranged along one direction. Hereinafter, the direction in which the index module 10 and the treating module 20 are arranged is referred to as a first direction 92. When viewed from above, a direction perpendicular to the first direction 92 is referred to as a second direction 94. A direction perpendicular to both the first direction 92 and the second direction 94 is referred to as a third direction 96.

The index module 10 transfers a substrate W from a container 80 where the substrate W is stored to the treating module 20 and transfers the substrate W treated in the treating module 20 to the container 80. A length direction of the index module 10 is the second direction 94. The index module 10 has a load port 12 and an index frame 14. The load port 12 is opposite to the treating module 20 around the index frame 14. The container 80 containing the substrates W therein is placed on the load port 12. A plurality of load ports 12 may be provided. The plurality of the load port 12 may be arranged along the second direction 94.

The container 80 may include a sealing container such as FOUP (Front Open Unified Pod). The container 80 may be placed on the load port 12 by an operator or transfer means (not shown) such as an overhead transfer, an overhead conveyor, or an automatic guided vehicle.

The index frame 14 has an index robot 120. The index frame 14 has a guide rail 140 whose a length direction is the second direction 94. The index robot 120 may be configured to be movable on the guide rail 140. The index robot 120 includes a hand 122 on which the substrate W is placed. The hand 122 may be configured to be capable of moving forward and backward, rotating about the third direction 96, and moving along the third direction 96. A plurality of hands 122 may be arranged and may be spaced apart from each other in a vertical direction. The hands 122 may move forward and backward independently of each other.

The treating module 20 includes a buffer unit 200, a transfer apparatus 300, a liquid treating apparatus 400, and a cleaning apparatus 500. The buffer unit 200 provides a space in which the substrate W carried into the treating module 20 and the substrate W carried out from the treating module 20 temporarily stay. The liquid treating apparatus 400 performs a liquid treating process of supplying liquid on the substrate W to treat the substrate W using the liquid. The cleaning apparatus 500 performs a drying process to remove the liquid remaining on the substrate W. The transfer apparatus 300 transports the substrate W between the buffer unit 200, the liquid treating apparatus 400, and the cleaning apparatus 500.

The transfer apparatus 300 may have a length direction of the first direction 92. The buffer unit 200 may be disposed between the index module 10 and the transfer apparatus 300. The liquid treating apparatus 400 and the cleaning apparatus 500 may be disposed on a side portion of the transfer apparatus 300. The liquid treating apparatus 400 and the transfer apparatus 300 may be arranged along the second direction 94. The cleaning apparatus 500 and the transfer apparatus 300 may be arranged along the second direction 94. The buffer unit 200 may be located at one end of the transfer apparatus 300.

In one example, the liquid treating apparatuses 400 may be disposed on both sides of the transfer apparatus 300, respectively. The cleaning apparatuses 500 may be disposed on both sides of the transfer apparatus 300, respectively. The liquid treating apparatuses 400 may be closer to the buffer unit 200 than to the cleaning apparatus 500. On one side of the transfer apparatus 300, the liquid treating apparatuses 400 may be arranged in a matrix of A×B (each of A and B being a natural number of 1 or greater) along the first direction 92 and the third direction 96, respectively. Further, on one side of the transfer apparatus 300, the cleaning apparatuses 500 may be arranged in a matrix of C×D (each of C and D being a natural number of 1 or greater) along the first direction 92 and the third direction 96, respectively. Alternatively, only the liquid treating apparatuses 400 may be disposed on one side of the transfer apparatus 300, while only the cleaning apparatuses 500 may be disposed on the other side thereof.

The transfer apparatus 300 has a transfer robot 320. The transfer apparatus 300 has a guide rail 340 whose a length direction is the first direction 92. The transfer robot 320 may be configured to be movable on the guide rail 340. The transfer robot 320 includes a hand 322 on which the substrate W is placed. The hand 322 may be configured to be able to move forward and backward, rotate about the third direction 96, and move along the third direction 96. A plurality of hands 322 may be arranged and spaced apart from each other in the vertical direction. The hands 322 may move forward and backward independently of each other.

The buffer unit 200 has a plurality of buffers 220 on which the substrate W is placed. The buffers 220 may be constructed to be spaced apart from each other along the third direction 96. The buffer unit 200 has an open front surface and an open rear surface. The front surface faces the index module 10, and the rear surface faces the transfer apparatus 300. The index robot 120 accesses the buffer unit 200 through the front surface. The transfer robot 320 may access the buffer unit 200 through the rear surface.

Figure 2:
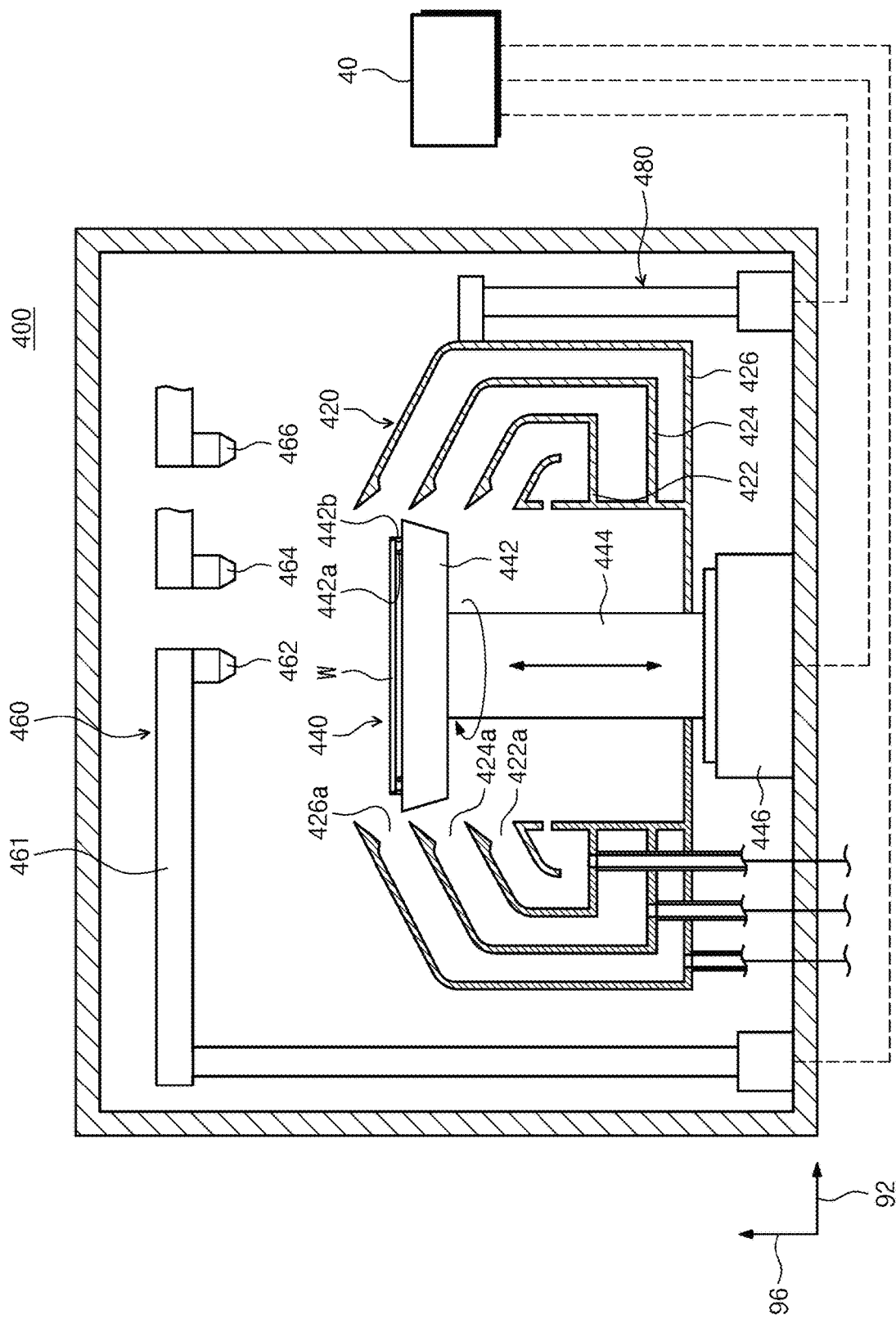
FIG. 2 is a diagram schematically showing one embodiment of a liquid treating apparatus of FIG. 1.

FIG. 2 is a diagram schematically showing one embodiment of the liquid treating apparatus 400 of FIG. 1. Referring to FIG. 2, the liquid treating apparatus 400 has a housing 410, a cup 420, a support unit 440, a liquid supply unit 460, and an ascending and descending unit 480. The housing 410 is generally formed in a rectangular parallelepiped shape. The cup 420, the support unit 440, and the liquid supply unit 460 are disposed in the housing 410.

The cup 420 has a treatment space with an open top. The substrate W is treated with liquid in the treatment space. The support unit 440 supports the substrate W within the treatment space. The liquid supply unit 460 supplies the liquid onto the substrate W supported by the support unit 440. The liquid has plural types. The liquids of the plural types may be fed sequentially onto the substrate W. The ascending and descending unit 480 adjusts a relative height between the cup 420 and the support unit 440.

In one example, the cup 420 has a plurality of the collection vessels 422, 424, and 426. Each of the collection vessels 422, 424 and 426 has a collection space for collecting the liquid used to treat the substrate. Each of the collection vessels 422, 424, and 426 is formed in a ring shape surrounding the support unit 440. As the liquid treating process proceeds, pre-treatment liquid scattered by rotation of the substrate W enters the collection space through each of inlets 422a, 424a, and 426a of the collection vessels 422, 424, and 426, respectively. In one example, the cup 420 has the first collection vessel 422, the second collection vessel 424, and the third collection vessel 426. The first collection vessel 422 is constructed to surround the support unit 440, the second collection vessel 424 is constructed to surround the first collection vessel 422, the third collection vessel 426 is constructed to surround the second collection vessel 424. The second inlet 424a through which the liquid is fed into the second collection vessel 424 may be located above the first inlet 422a through which the liquid is fed into the first collection vessel 422. The third inlet 426a through which the liquid is fed into the third collection vessel 426 may be positioned above the second inlet 424a.

The support unit 440 has a support plate 442 and a drive shaft 444. A top surface of the support plate 442 may be generally formed in a circular shape and may have a larger diameter than that of the substrate W. A support pin 442a is disposed at a center of the support plate 442 to support a rear surface of the substrate W. The support pin 442a has a top protruding from the support plate 442 so that the substrate W is spaced, by a certain distance, from the support plate 442. A chuck pin 442b is disposed at an edge of the support plate 442. The chuck pin 442b protrudes upward from the support plate 442 and supports a side portion of the substrate W so that the substrate W does not deviate from the support unit 440 when the substrate W is rotated. The drive shaft 444 is driven by an actuator 446, and is connected to a center of a bottom surface of the substrate W, and rotates the support plate 442 about a central axis thereof.

In one example, the liquid supply unit 460 has a first nozzle 462, a second nozzle 464, and a third nozzle 466. The first nozzle 462 feeds first liquid onto the substrate W. The first liquid may be liquid removing a film or foreign substances remaining on the substrate W. The second nozzle 464 feeds second liquid onto the substrate W. The second liquid may be liquid soluble in third liquid. For example, the second liquid may be liquid that is more soluble in the third liquid than the first liquid is. The second liquid may be liquid that neutralizes the first liquid supplied on the substrate W. Further, the second liquid may be liquid that neutralizes the first liquid and at the same time is more soluble in the third liquid than the first liquid is. In one example, the second liquid may be water. The third nozzle 466 feeds the third liquid onto the substrate W. The third liquid may be liquid that is well soluble in supercritical fluid used in the cleaning apparatus 500. For example, the third liquid may be liquid that is more soluble in the supercritical fluid used in the cleaning apparatus 500 than the second liquid is. In one example, the third liquid may be an organic solvent. The organic solvent may be isopropyl alcohol (IPA). In one example, the supercritical fluid may be carbon dioxide. The first nozzle 462, the second nozzle 464, and the third nozzle 466 are supported on different arms 461. These arm 461 may be moved independently. Alternatively, the first nozzle 462, the second nozzle 464, and the third nozzle 466 may be mounted on the same arm and moved simultaneously.

The ascending and descending unit 480 moves the cup 420 in the vertical direction. The relative height between the cup 420 and the substrate W is changed due to the vertical movement of the cup 420. Accordingly, the collection vessels 422, 424, and 426 for collecting the pre-treatment liquid are changed according to a type of the liquid supplied to the substrate W, so that the liquids may be collected, separately. Alternatively, the cup 420 may be fixedly installed, and the ascending and descending unit 480 may move the support unit 440 in the vertical direction.

Figure 3:
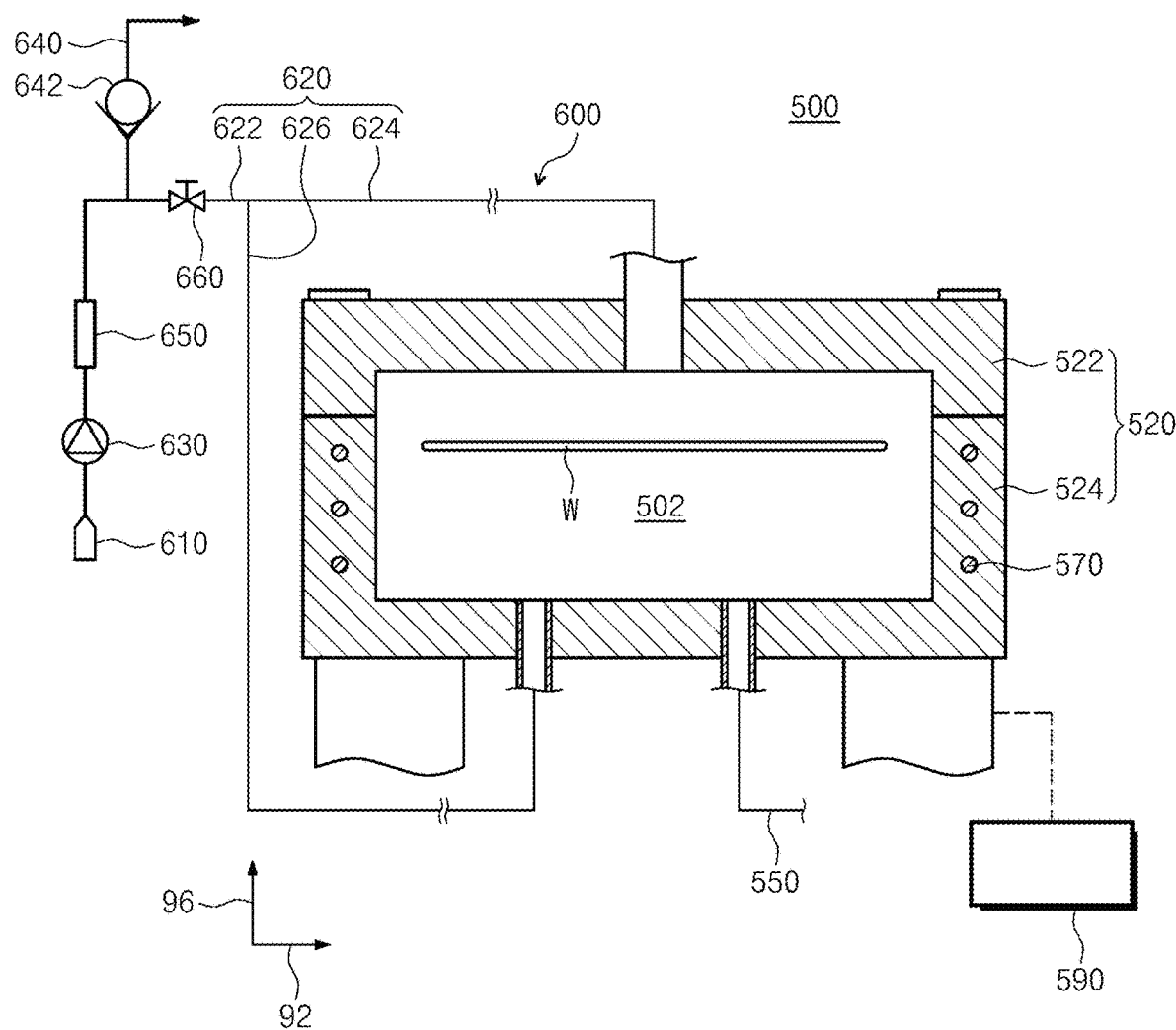
FIG. 3 is a diagram schematically showing one embodiment of a cleaning apparatus of FIG. 1.

FIG. 3 is a diagram schematically showing one embodiment of the cleaning apparatus 500 of FIG. 1. According to one embodiment, the cleaning apparatus 500 uses the supercritical fluid to remove the liquid on the substrate W. The cleaning apparatus 500 has a body 520, a support (not shown), a fluid supply unit 600, and a blocking plate (not shown).

The body 520 provides a treatment space 502 in which a cleaning process is performed. The body 520 has an upper body 522, and a lower body 524. The upper body 522 and the lower body 524 are combined with each other to provide the treatment space 502 as described above. The upper body 522 is located above the lower body 524. The upper body 522 has a fixed position. The lower body 524 may be moved up and down by a driving member 590 such as a cylinder. When the lower body 524 is separated from the upper body 522, the treatment space 502 is opened, and thus the substrate W is brought into or out of the treatment space 502. During the process, the lower body 524 is in close contact with the upper body 522, and thus the treatment space 502 is sealed from an outside. The cleaning apparatus 500 has a heater 570. In one example, the heater 570 is located inside a wall of the body 520. The heater 570 heats the treatment space 502 of the body 520 so that the fluid supplied into the interior space of the body 520 maintains a supercritical state. The interior of the treatment space 502 has an atmosphere of the supercritical fluid.

The support (not shown) supports the substrate W within the treatment space 502 of the body 520. The support (not shown) has a fixing rod (not shown) and stand device (not shown). The fixing rod (not shown) is fixed to the upper body 522 so as to protrude downward from a bottom surface of the upper body 522. The fixing rod (not shown) has a length-direction as the vertical direction. A plurality of fixing rods (not shown) are arranged and are spaced apart from each other. The fixing rods (not shown) are arranged such that when the substrate W is brought into or out of a space surrounded with the fixing rods, the substrate W does not interfere with the fixing rods (not shown). The stand device (not shown) is coupled to each of the fixing rods (not shown). The stand device (not shown) extends from a bottom of the fixing rod (not shown) in a direction toward the space surrounded with the fixing rods (not shown). Due to the above-described structure, an edge region of the substrate W brought into the treatment space 502 of the body 520 is placed on the stand device (not shown), and an entire region of a top surface of the substrate W, a central region of a bottom surface of the substrate W, and a portion of an edge region of the bottom surface of the substrate W are exposed to the cleaning fluid supplied to the treatment space 502.

The fluid supply unit 600 supplies the cleaning fluid to the treatment space 502 of the body 520. In one example, the cleaning fluid may be supplied to the treatment space 502 in a supercritical state. Alternatively, the cleaning fluid may be supplied to the treatment space 502 in a gas state, and then in the treatment space 502, a phase thereof may be changed to the supercritical state.

In one example, the fluid supply unit 600 may include a fluid supply source 610, a supply line 620, a pump 630, a vent line 640, a relief valve 642, a reservoir 650, and an opening and closing valve 660.

One end of the supply line 620 may be connected to the fluid supply source 610. The supply line may receive supercritical state carbon dioxide from the fluid supply source. The supply line 620 may include a main supply line 622, an upper branched line 624, and a lower branched line 626.

The upper branched line 624 and the lower branched line 626 are branched from the main supply line 622. The upper branched line 624 is coupled to the upper body 522 to supply the cleaning fluid downwardly onto the substrate W placed on a support 540. In one example, the upper branched line 624 is joined to a center of the upper body 522. The lower branched line 626 is coupled to the lower body 524 to supply the cleaning fluid upwardly onto the substrate W placed on the support 540. In one example, the lower branched line 626 may be coupled to a center of the lower body 524. An exhaust unit 550 is coupled to the lower body 524. When the lower branched line 626 is coupled to the center of the lower body 524, an exhaust port of the exhaust unit 550 may be positioned in a biased manner from the center of the lower body 524. The supercritical fluid in the treatment space 502 of the body 520 is exhausted out of the body 520 through the exhaust unit 550.

The pump 630 is installed in the main supply line 622 to provide flow pressure to the fluid. The vent line 640 is installed between a branch point where the upper branched line 624 and the lower branched line 626 branch from the main supply line 622 and the pump 630 to discharge pressure in the fluid to an outside. The relief valve 642 is installed in the vent line 640 and is configured to open the vent line 640 when the fluid pressure on the main supply line 622 rises above a preset pressure. The opening and closing valve 660 is installed in the main supply line 622 to control fluid supply.

The reservoir 650 is installed between a branch point where the vent line 640 branches from the main supply line 622 and the pump 630.

Figure 4:
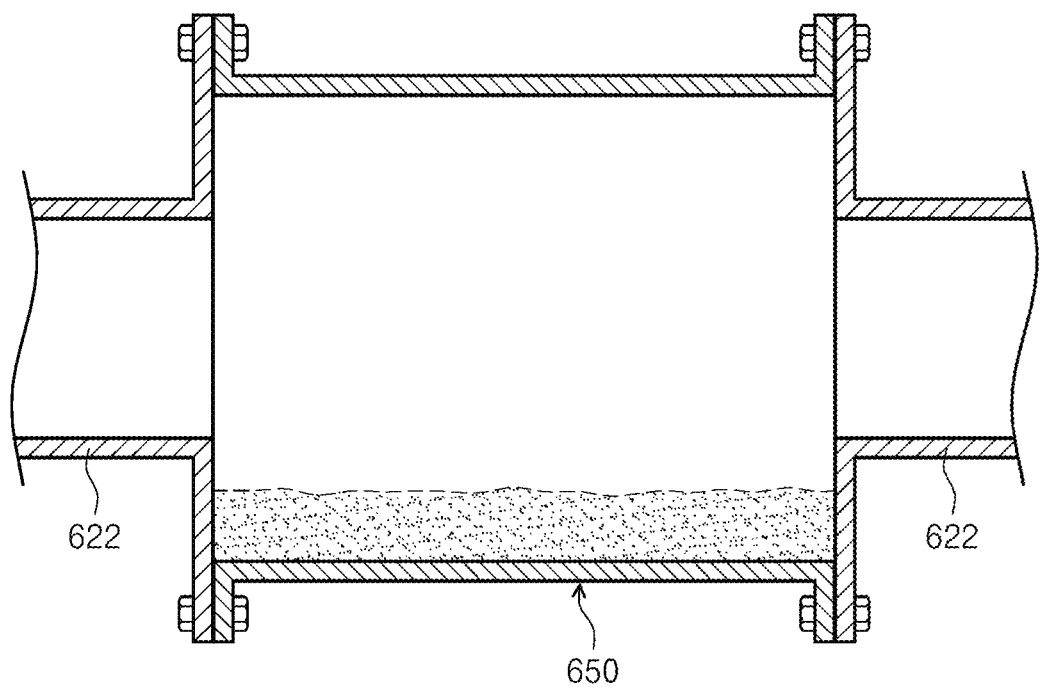
FIG. 4 is a view showing a reservoir shown in FIG. 3.

FIG. 4 is a view showing the reservoir shown in FIG. 3.

Referring to FIG. 3 and FIG. 4, the reservoir 650 has a flow-path enlarging pipe shape having a cross-sectional area larger than a cross-sectional area of the main supply line 622. In one example, the reservoir 650 may store inertia fluid having inertia for suppressing pressure hunting phenomenon of the fluid. For example, the inertia fluid may be liquid containing carbon dioxide therein. The reservoir 650 has a larger cross-sectional area than the cross-sectional area of the main supply line 622. Thus, when the system stops abnormally, the pressure hunting in the main supply line 622 may be suppressed based on the inertia of the inertia fluid stored in the reservoir 650, thereby to prevent possibility of damage of the relief valve 642 and contamination. Further, when the pressure hunting occurs in the main supply line 622 adjacent to the pump 630, the fluid flows into the large space of the reservoir 650 such that the pressure hunting may be relieved.

Figure 5:
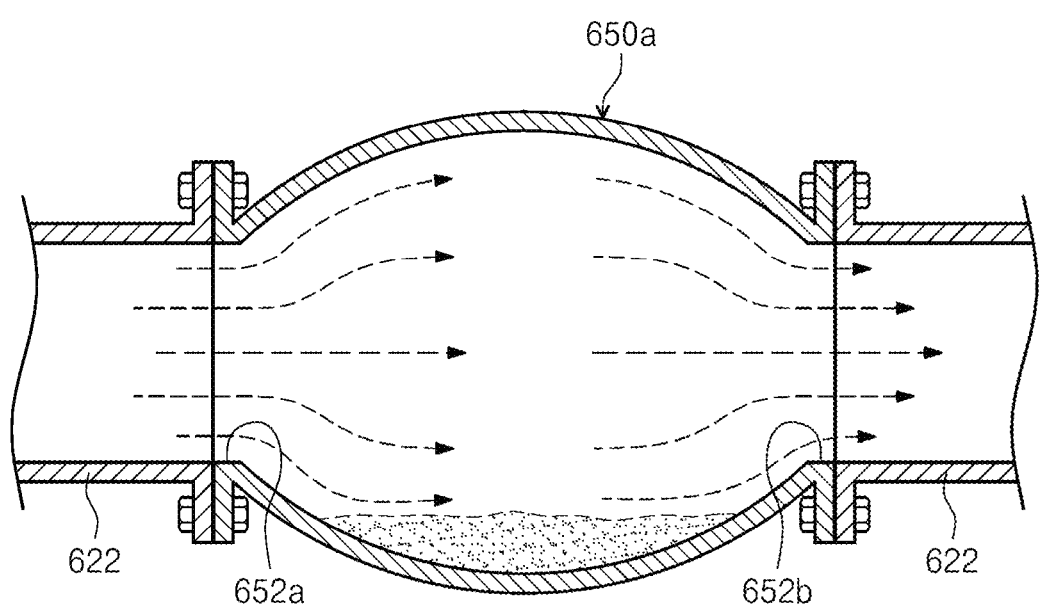
FIG. 5 is a view showing another example of the reservoir.

FIG. 5 is a view showing another example of the reservoir.

A reservoir 650a shown in FIG. 5 has a rugby ball shape in which both ends 652a and 652b connected to the main supply line 622 have the same cross-sectional area as that of the main supply line 622 and a cross-sectional area thereof gradually increases as it extend from each end to a center of the reservoir 650a. In the reservoir 650a in the shape of the rugby ball, fluid flow may be smooth as shown by an arrow when the fluid is introduced and diffused therein.

According to one embodiment of the inventive concept, the pressure hunting phenomenon in the supply line of the supercritical fluid may be suppressed.

The effect of the inventive concept is not limited to the above-described effects. Effects not mentioned may be clearly understood by those skilled in the art to which the inventive concept belongs from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

| Reference numerals | |
|---|---|
| 400: Liquid treating apparatus | 410: Housing |
| 420: Cup | 440: Support unit |
| 500: Cleaning apparatus | 600: Liquid supply unit |
| 610: Fluid supply source | 620: Supply line |
| 630: Pump | 640: Vent line |
| 650: Reservoir | 660: Opening and closing valve |

What is claimed is:

1. An apparatus for treating a substrate, the apparatus comprising:
   a process chamber having a treatment space for treating the substrate;
   a fluid supply unit configured to supply a fluid to the treatment space,
   wherein the fluid supply unit includes:
      a supply pipe connected to the treatment space, the supply pipe configured to supply the fluid to the treatment space;
      a pump in the supply pipe, the pump configured to provide flow pressure to the fluid;
      a vent line between the pump and the process chamber, the vent line configured to discharge pressure in the fluid to an outside of the apparatus;
      a relief valve configured to open and close the vent line; and
      a reservoir between the pump and a first branch point where the vent line branches from the supply pipe,
      wherein the reservoir has a first cross-sectional area larger than a second cross-sectional area of a portion of the supply pipe located between the pump and the branch point.

2. The apparatus of claim 1, wherein the reservoir has a pipe shape.

3. The apparatus of claim 1, wherein the reservoir includes two ends, both ends of the reservoir having the second cross-sectional area.

4. The apparatus of claim 3, wherein the first cross-sectional area of the reservoir increases from each end of the reservoir toward a middle point of the reservoir.

5. The apparatus of claim 3, wherein the reservoir has an oblong shape.

6. The apparatus of claim 1, wherein the fluid is supercritical state fluid.

7. The apparatus of claim 6, wherein the fluid is Carbon Dioxide.

8. The apparatus of claim 1, wherein the reservoir is configured to hold inertia fluid having inertia for suppressing pressure hunting of the fluid.

9. The apparatus of claim 8, wherein the reservoir is configured to hold the inertia fluid such that the inertia fluid held in the reservoir remains in the reservoir during a flow of the fluid through the reservoir and after the fluid ceases to flow through the reservoir.

10. The apparatus of claim 1, wherein the supply pipe includes an upper branched pipe configured to supply the fluid to a top portion of the process chamber and a lower branched pipe configured to supply the fluid to a bottom portion of the process chamber.

11. The apparatus of claim 10, wherein the upper branched pipe and the lower branched pipe branch from the supply pipe at a second branch point between the first branch point and the process chamber.

12. The apparatus of claim 1, wherein the pump is located upstream of the reservoir.

13. The apparatus of claim 1, wherein the supply pipe is located between a fluid supply source and the process chamber.

14. A fluid supply unit comprising:
a supply pipe configured to convey a fluid;
a pump in the supply pipe configured to provide flow pressure to the fluid;
a vent line at a rear end of the pump configured to discharge pressure in the fluid to an outside of the fluid supply unit; and
a relief valve in the vent line, the relief valve configured to open and close the vent line,
wherein the supply pipe includes a flow-path enlarging pipe between the pump and a branch point where the vent line branches from the supply pipe, the flow-path enlarging pipe having a first cross-sectional area larger than a second cross-sectional area of the supply pipe configured to alleviate pressure variation in the supply pipe.

15. The fluid supply unit of claim 14, wherein the fluid is supercritical state fluid.

16. The fluid supply unit of claim 15, wherein the fluid is Carbon Dioxide.

17. The fluid supply unit of claim 14, wherein the flow-path enlarging pipe is configured to hold an inertia fluid having inertia to suppress a pressure hunting phenomenon of the fluid.

18. The fluid supply unit of claim 14, wherein the flow-path enlarging pipe includes two ends, both ends of the flow-path enlarging pipe having the second cross-sectional area.

19. The fluid supply unit of claim 18, wherein the first cross-sectional area of the flow-path enlarging pipe increases from each end of the flow-path enlarging pipe toward a middle point of the flow-path enlarging pipe.

20. The fluid supply unit of claim 18, wherein the flow-path enlarging pipe has an oblong shape.

* * * * *